United States Patent
Lan et al.

(10) Patent No.: US 9,343,403 B2
(45) Date of Patent: May 17, 2016

(54) STRESS MITIGATION STRUCTURE FOR WAFER WARPAGE REDUCTION

(71) Applicant: QUALCOMM Incorporated, San Diego, CA (US)

(72) Inventors: Je-Hsiung Jeffrey Lan, San Diego, CA (US); David Francis Berdy, San Diego, CA (US); Chengjie Zuo, Santee, CA (US); Daeik Daniel Kim, San Diego, CA (US); Changhan Hobie Yun, San Diego, CA (US); Mario Francisco Velez, San Diego, CA (US); Niranjan Sunil Mudakatte, San Diego, CA (US); Robert Paul Mikulka, Oceanside, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/483,944

(22) Filed: Sep. 11, 2014

(65) Prior Publication Data
US 2015/0287677 A1    Oct. 8, 2015

Related U.S. Application Data

(60) Provisional application No. 61/975,570, filed on Apr. 4, 2014.

(51) Int. Cl.
| | |
|---|---|
| *H01L 23/522* | (2006.01) |
| *H01L 21/283* | (2006.01) |
| *H01L 21/768* | (2006.01) |
| *H01L 23/528* | (2006.01) |
| *H01L 23/532* | (2006.01) |
| *H01L 49/02* | (2006.01) |

(52) U.S. Cl.
CPC .......... *H01L 23/5227* (2013.01); *H01L 21/283* (2013.01); *H01L 21/76877* (2013.01); *H01L 23/522* (2013.01); *H01L 23/528* (2013.01); *H01L 23/5223* (2013.01); *H01L 23/5329* (2013.01); *H01L 23/5226* (2013.01); *H01L 28/10* (2013.01); *H01L 28/60* (2013.01)

(58) Field of Classification Search
CPC ..................... H01L 23/5227; H01L 21/76877; H01L 23/5226; H01L 23/5223; H01L 23/528; H01L 21/283
USPC ............ 257/71, 296, 300, 516, 532; 438/170, 438/190, 238
See application file for complete search history.

(56) References Cited

U.S. PATENT DOCUMENTS

| | | | |
|---|---|---|---|
| 6,577,011 | B1 | 6/2003 | Buchwalter et al. |
| 7,847,402 | B2 | 12/2010 | Restaino et al. |
| 7,977,201 | B2 | 7/2011 | Abadeer et al. |

(Continued)

OTHER PUBLICATIONS

International Search Report and Written Opinion—PCT/US2015/022538—ISA/EPO—Jul. 28, 2015.

*Primary Examiner* — Jarrett Stark
*Assistant Examiner* — Shahed Ahmed
(74) *Attorney, Agent, or Firm* — Seyfarth Shaw LLP (57) ABSTRACT

An integrated circuit device includes a substrate. The integrated circuit device also includes a first conductive stack including a back-end-of-line (BEOL) conductive layer at a first elevation with reference to the substrate. The integrated circuit device also includes a second conductive stack including the BEOL conductive layer at a second elevation with reference to the substrate. The second elevation differs from the first elevation.

10 Claims, 9 Drawing Sheets

(56) References Cited

U.S. PATENT DOCUMENTS

| | | |
|---|---|---|
| 8,624,323 B2 | 1/2014 | Gates et al. |
| 2007/0141800 A1 | 6/2007 | Kurihara et al. |
| 2010/0301452 A1 | 12/2010 | Wang |
| 2011/0193197 A1 | 8/2011 | Farooq et al. |
| 2013/0043560 A1* | 2/2013 | Tzeng ................ H01L 23/5223 257/532 |
| 2013/0113068 A1 | 5/2013 | Ramachandran et al. |
| 2013/0320539 A1* | 12/2013 | Wang ................ H01L 21/76802 257/751 |

* cited by examiner

STRESS MITIGATION STRUCTURE FOR WAFER WARPAGE REDUCTION

CROSS REFERENCE TO RELATED APPLICATIONS

The present application claims the benefit of U.S. Provisional Patent Application No. 61/975,570 filed on Apr. 4, 2014, in the names of Je-Hsiung Jeffrey Lan et al., the disclosure of which is expressly incorporated by reference herein in its entirety.

TECHNICAL FIELD

The present disclosure generally relates to integrated circuits (ICs). More specifically, the present disclosure relates to a stress mitigation structure for wafer warpage reduction.

BACKGROUND

The process flow for semiconductor fabrication of integrated circuits (ICs) may include front-end-of-line (FEOL), middle-end-of-line (MEOL), and back-end-of-line (BEOL) processes. The FEOL process may include wafer preparation, isolation, well formation, gate patterning, spacer, extension and source/drain implantation, silicide formation, and dual stress liner formation. The MEOL process may include gate contact formation. The BEOL processes may include a series of wafer processing steps for interconnecting the semiconductor devices created during the FEOL and MEOL processes. Successful fabrication and qualification of modern semiconductor chip products involves an interplay between the materials and the processes employed. In particular, the formation of conductive material plating for passive on glass (POG) devices in BEOL processes is an increasingly challenging part of the process flow.

SUMMARY

An integrated circuit device includes a substrate. The integrated circuit device also includes a first conductive stack including a back-end-of-line (BEOL) conductive layer at a first elevation with reference to the substrate. The integrated circuit device also includes a second conductive stack including the BEOL conductive layer at a second elevation with reference to the substrate. The second elevation differs from the first elevation.

A method of fabricating an integrated circuit device includes depositing and patterning a first conductive layer directly on a surface of a substrate, depositing a first interlayer dielectric only on surfaces of the first conductive layer, and depositing and patterning a dielectric layer on the first conductive layer. The method also includes depositing and patterning a second conductive layer on the dielectric layer, depositing and patterning a third conductive layer directly on the first interlayer dielectric and coupled to the first conductive layer through a first via to form a first conductive stack, and depositing and patterning the third conductive layer directly on the surface of the substrate to form a second conductive stack adjacent to the first conductive stack.

An integrated circuit device includes a means for supporting. The integrated circuit device also includes a first conductive stack including a back-end-of-line (BEOL) conductive layer at a first elevation with reference to the supporting means. The integrated circuit device also includes a second conductive stack including the BEOL conductive layer at a second elevation with reference to the supporting means. The second elevation differs from the first elevation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

High-performance integrated passive devices use high Q components (such as inductors or capacitors) having thick conductive layers to reduce insertion loss. To obtain thick conductive layers, thick interlayer dielectric layers isolate adjacent conductive layers to obtain passivation of the top conductive layer. Interlayer dielectrics usually have very high coefficients of thermal expansion (CTE), which often mismatch the CTE of the substrate in the integrated passive device, which may be glass or other like low-loss material.

During the fabrication process of an integrated passive device, a spin-coated interlayer dielectric layer may experience shrinkage after the thermal curing process. The CTE mismatch between the thick interlayer dielectric layer and the patterned conductive layers on the substrate surface may also lead to wafer warpage.

The degree of wafer warpage also depends on the thickness of the interlayer dielectric and the substrate, as well as the manner of patterning of the conductive layer. Wafer warpage is especially likely in devices with thin substrates that have thick interlayer dielectric layers with a large CTE mismatch. Wafer warpage leads to difficulties in wafer handling and also limits the efficiency, quality and dependability of various device manufacturing processes.

Conventional stress mitigation structures may pattern specific interlayer dielectric layers around certain regions with conductive layers to reduce the wafer warpage by roughly 15-20% in certain designs. Nevertheless, further reduction in wafer warpage is desirable, especially because aligned wafers that have not experienced warpage may be used in thin-wafer laser marking processes as well as precise dicing singulation processes.

A novel stress mitigation structure (SMS) is provided where the interlayer dielectric layers are patterned and designed around certain regions to reduce wafer warpage. The interlayer dielectric layers may be removed outside passive components such as metal-insulator-metal (MIM) capacitors or inductors and wafer level chip scale package (WLCSP) pads. In addition, the interlayer dielectric layer may be removed inside the MIM capacitors and inductors. In one configuration, an integrated passive device includes a single interlayer dielectric layer on an outermost conductive layer, no interlayer dielectric layers under the outermost conductive layer, and only one interlayer dielectric layer between the adjacent conductive layers to provide a stress mitigation structure. The stress mitigation structure and design may extend to reverse a tone of an interlayer dielectric via mask design (e.g., from a dark field to a light field), where (i) the interlayer dielectric layer remains in the MIM capacitor, inductor, WLCSP pad regions and (ii) most of the area of the interlayer dielectric layer(s) are removed.

The advantages of the novel stress mitigation structure, in one aspect of the present disclosure, include decreased wafer warpage when compared to conventional stress mitigation structures, in addition to reduction of interlayer dielectric material consumption. Interlayer dielectric material consumption is particularly reduced if the mask tone is changed and a printing or lamination technique (e.g., a dry-film process) is the chosen process to fabricate the integrated passive device.

Figure 1:
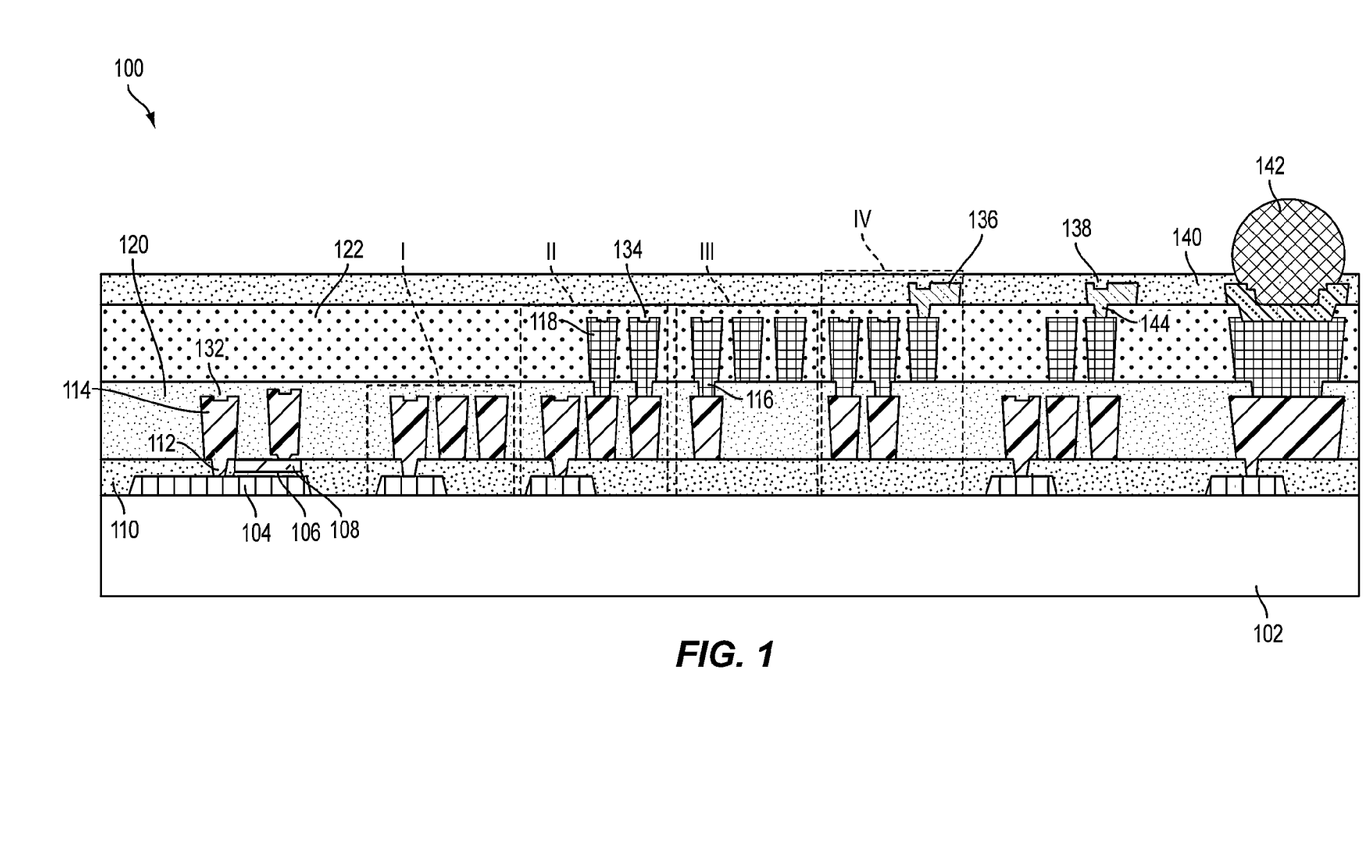
FIG. 1 shows a cross-sectional view of an integrated circuit device including back-end-of-line (BEOL) layers that may stress a substrate, wafer or panel of the integrated circuit device.

FIG. 1 shows a cross-sectional view of an integrated circuit device 100 including back-end-of-line (BEOL) layers that may stress a substrate of the integrated circuit device. Although described with reference to a substrate, it should be recognized that aspects of the present disclosure may be applied to a substrate, wafer or panel for an integrated circuit device. In addition, the substrate, wafer or panel may include passive devices (e.g., inductors, capacitors, and resistors, etc.) and/or semiconductor devices, (e.g., transistors, sensors, etc.), micro electro mechanical (MEMS) active devices, or other like active or passive devices.

The integrated circuit device 100 includes a substrate 102, a first interlayer dielectric 110 (ILD-1), a second interlayer dielectric 120 (ILD-2), a third interlayer dielectric 122 (ILD-3), and a fourth interlayer dielectric 140 (e.g., a passivation (PSV) layer). The first interlayer dielectric 110 surrounds a first conductive layer 104 (e.g., metal one (M1)), a dielectric layer 106, a second conductive layer 108 (e.g., metal two (M2)) and a first via 112. The second interlayer dielectric 120 surrounds a third conductive layer 114 (e.g., metal three (M3)) and a second via 116. The third interlayer dielectric 122 surrounds a fourth conductive layer 118 (e.g., metal four (M4)). The third interlayer dielectric 122 may also function as a passivation layer if it is the outer most layer. Via holes (not shown) may be formed through the various dielectric layers to expose a surface of the substrate 102 and to provide stress mitigation, for example, as shown in FIG. 3B.

The substrate 102 can be glass or other like low-loss material and may support a metal-insulator-metal (MIM) capacitor including the first conductive layer 104, the dielectric layer 106 and the second conductive layer 108. These layers (e.g., 104, 106, 108) may also be arranged to form other devices such as inductors. The integrated circuit device 100 may be fabricated using a single-sided or double-sided passive on glass (POG) process in which the conductive layers and dielectric layers are formed on a single side or both sides of the substrate 102. In the case of the double-sided POG process, through-glass via (TGV) technology may be used as a bridge for an electrical interconnect between integrated passive devices (IPD) on the front and on the back side of the substrate 102.

The integrated circuit device 100 also includes a third conductive layer gap 132, a fourth interlayer dielectric 140, a fourth conductive layer gap 134, a fifth conductive layer 136, a fifth conductive layer gap 138, an interconnect 142, and a third via 144. The fourth conductive layer 118 is coupled to the fifth conductive layer 136 through the third via 144, which may also fit within the fourth conductive layer gap 134. The integrated circuit device 100 also includes four conductive stacks: a first conductive stack I, a second conductive stack II, a third conductive stack III, and a fourth conductive stack IV.

The first conductive stack I shows the first conductive layer 104, surrounded by the first interlayer dielectric 110, and coupled to the third conductive layer 114. The first via 112 and the third conductive layer 114 are surrounded by the second interlayer dielectric 120. As can be seen in the first conductive stack I, however, there are no conductive layer components in the third interlayer dielectric 122 and the fourth interlayer dielectric 140. Therefore, these upper dielectric layers provide little benefit to the first conductive stack I.

The second conductive stack II shows similar components to the first conductive stack I, but also includes the fourth conductive layer 118 coupled to the third conductive layer 114 through the second via 116. Again, there are no components in the fourth conductive layer 118, which appears to consume additional space. The same can be said for the third conductive stack III, which shows no first conductive layer 104, but instead includes a single pillar of the third conductive layer 114 material coupled to the fourth conductive layer 118 by the second via 116. The fourth conductive layer 118 is again wasted in the third conductive stack III because it does not surround any components.

The fourth conductive stack IV is similar to the third conductive stack III with the exception of an additional pillar of the third conductive layer 114 material and the presence of the fifth conductive layer 136 in the fourth interlayer dielectric 140. The fourth interlayer dielectric 140 surrounds the fifth conductive layer 136 and a portion of the interconnect 142 and therefore, it has an additional purpose beyond simply being an insulation layer. Nevertheless, other dielectric layers in other portions of the integrated circuit device do not surround any conductive layers or any other components. Such dielectric layers (e.g., the third interlayer dielectric 122 and the fourth interlayer dielectric 140 in the first conductive stack I, and the fourth interlayer dielectric 140 in conductive stacks II and III) could be removed to conserve space as well as to reduce interlayer dielectric material consumption.

Figure 2A:
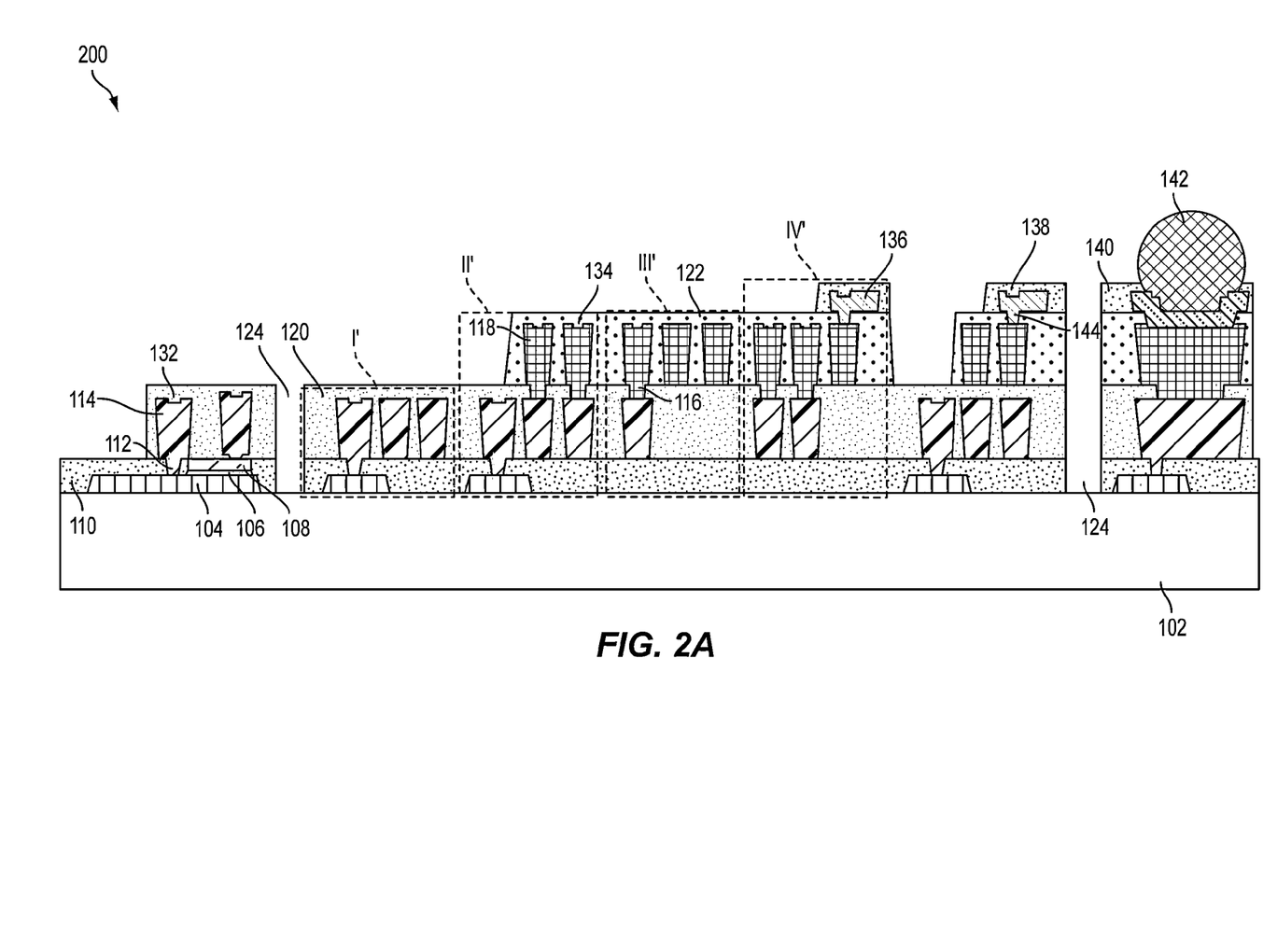
FIGS. 2A to 2B show cross-sectional views of stress mitigation structures according to one aspect of the disclosure.
Figure 2B:
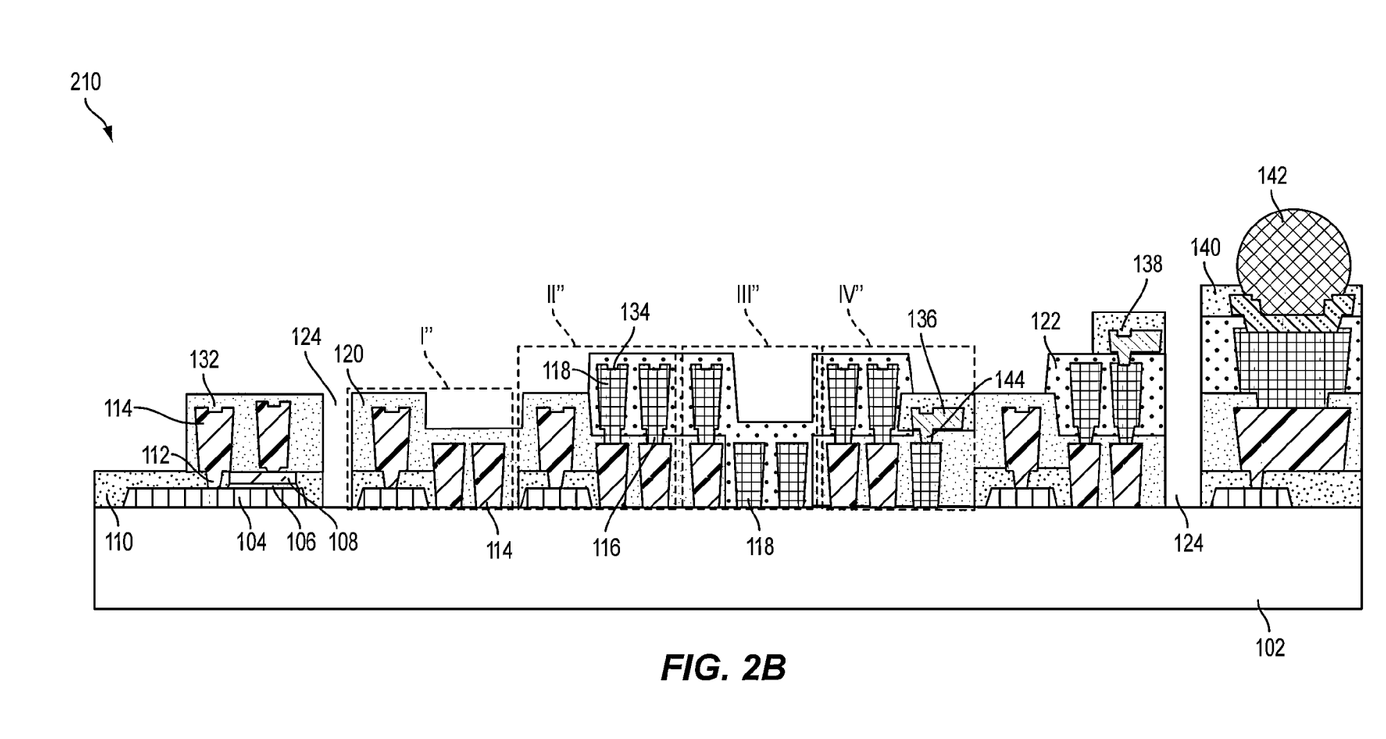

FIGS. 2A to 2B show cross-sectional views of stress mitigation structures (SMSs) according to one aspect of the disclosure.

FIG. 2A shows a stress mitigation structure 200 according to an aspect of the disclosure. In this configuration, the various portions of the stress mitigation structure 200 show the removal of dielectric layers when they do not surround any conductive layers, or the removal of dielectric layers when they serve no other purpose than being an insulation layer. For example, the stress mitigation structure 200 includes four conductive stacks: a first conductive stack I', a second conductive stack II', a third conductive stack III' and a fourth conductive stack IV'. As can be seen in the first conductive stack I', the topmost or highest conductive layer is the third conductive layer 114, which is surrounded by the second interlayer dielectric 120. In the second conductive stack II' and the third conductive stack III', the topmost or highest conductive layer is the fourth conductive layer 118, which is surrounded by the third interlayer dielectric 122. In the fourth conductive stack IV', the topmost or highest conductive layer is the fifth conductive layer 136, which is surrounded by the fourth interlayer dielectric 140. Therefore, dielectric layers only surround the topmost or highest conductive layers, and are not present when they only function as insulation layers and do not surround any conductive layers. This approach significantly conserves interlayer dielectric material and also reduces the overall interlayer dielectric thickness of the stress mitigation structure 200, therefore leading to a reduction in wafer warpage.

Also, as can be seen by the first conductive layer 104 on the far left, the first interlayer dielectric 110 is deposited or patterned on portions that only surround the first conductive layer 104, as well as the second conductive layer 108 and the dielectric layer 106.

The presence of via holes 124 in the stress mitigation structure 200 further reduces interlayer dielectric material consumption by further removing unnecessary interlayer dielectric material when it does not surround conductive layers. This in turn leads to a further reduction in wafer warpage.

FIG. 2B shows a stress mitigation semiconductor 210 according to an aspect of the disclosure. The configuration of the stress mitigation semiconductor 210 differs from the stress mitigation structure 200 of FIG. 2A by reducing the number of interlayer dielectric layers below the bottom-most conductive layer in each conductive stack, which reduces the overall interlayer dielectric thickness and the height of the device and therefore the amount of interlayer dielectric material surrounding all conductive layers. For example, the stress mitigation semiconductor 210 includes four conductive stacks: a first conductive stack I", a second conductive stack II", a third conductive stack III" and a fourth conductive stack IV".

The first conductive stack I" shows the third conductive layer 114 contacting the substrate 102, thereby lowering the height of the overall device as well as the placement of the second interlayer dielectric 120, which surrounds both the third conductive layer 114 and the first conductive layer 104. The second conductive stack II" is similar to the second conductive stack II' of the stress mitigation structure 200 from FIG. 2A. The third conductive stack III" shows the fourth conductive layer 118 contacting the substrate 102, thereby lowering the height of the device as well as the placement of the third interlayer dielectric 122, which surrounds the fourth conductive layer 118. The fourth conductive stack IV" is similar to the fourth conductive stack IV' of the stress mitigation semiconductor 210 from FIG. 2A.

In FIG. 2B a single interlayer dielectric layer is above or surrounding the topmost conductive layer (e.g., the fourth interlayer dielectric 140 surrounding the fifth conductive layer 136). In particular, no interlayer dielectric layer is under the bottommost conductive layer (no dielectric layer under the first conductive layer 104) and/or only one isolation interlayer dielectric layer is between the adjacent metal layers (e.g., the second interlayer dielectric 120 between the third conductive layer 114 and the fourth conductive layer 118, the third interlayer dielectric 122 between the fourth conductive layer 118 and the fifth conductive layer 136).

Figure 3A:
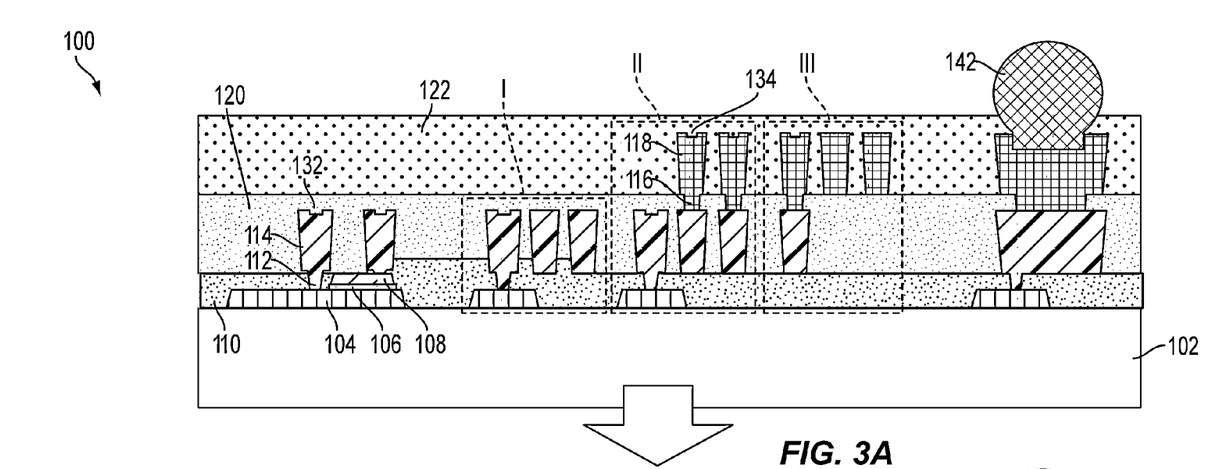
FIGS. 3A to 3B show a comparison between the integrated circuit device and a stress mitigation structure according to one aspect of the disclosure.
Figure 3B:
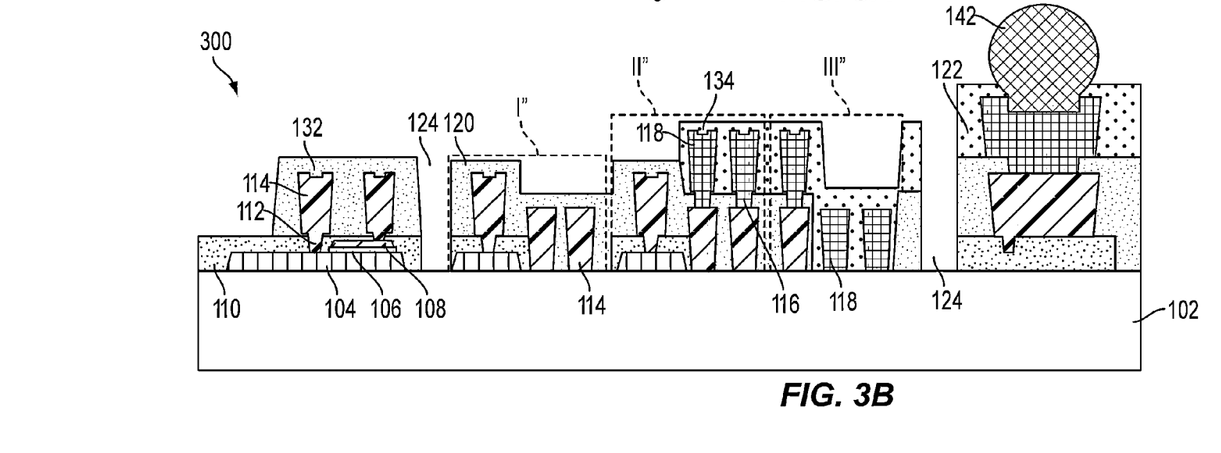

FIGS. 3A and 3B show a comparison between the integrated circuit device 100 of FIG. 1 and a stress mitigation structure according to aspects of the disclosure. The integrated circuit device 100 contains three conductive stacks: a first conductive stack I, a second conductive stack II, and a third conductive stack III. In the first conductive stack I, the entire portion of the third interlayer dielectric 122 is wasted and functions only as an insulation layer because it does not surround any conductive layers. In the second conductive stack II, a portion (to the left) of the third interlayer dielectric 122 is wasted because it does not surround any conductive layers and is only an insulation layer. In the third conductive stack III, an entire portion of the first interlayer dielectric 110, and a portion (to the right) of the second interlayer dielectric 120 are wasted because they only function as insulation layers and do not surround any conductive layers.

FIG. 3B shows a stress mitigation structure 300 according to an aspect of the disclosure. The interlayer dielectric material removal process described above in FIGS. 2A-2B is applied to the stress mitigation structure 300 in order to obtain the stress mitigation structure 300. The stress mitigation structure 300 has three conductive stacks that are improved versions of the conductive stacks shown in FIG. 3A. The first conductive stack I" removes the third interlayer dielectric 122 from the first conductive stack I of the IC device 100 in FIG. 3A. Furthermore, the third conductive layer 114 has been lowered in order to contact the substrate 102, thereby allowing more removal of the second interlayer dielectric 120 and further conservation of interlayer dielectric material, as well as a reduction in the height/space of the overall device.

The second conductive stack II" removes the left portion of the third interlayer dielectric 122 of the second conductive stack II from the IC device 100 in FIG. 3A. The third conductive stack III" removes both the first interlayer dielectric 110 and the rightmost portion of the second interlayer dielectric 120 of the third conductive stack III from the IC device 100 in FIG. 3A. Removing such unused dielectric layers also leads to the conservation of interlayer dielectric material and reduction of the size of the stress mitigation structure 300. Furthermore, the fourth conductive layer 118 is arranged to contact the substrate 102, which further reduces the height and makes the design more efficient by using less interlayer dielectric material.

In FIG. 3B, the first conductive stack I" can also include a back-end-of-line (BEOL) conductive layer made up of various layers such as the first conductive layer 104 and the third conductive layer 114. The second conductive stack II'' may also contain the same BEOL conductive layer. The BEOL conductive layer of the second conductive stack II'' may, however, include the fourth conductive layer 118.

In FIG. 3B, the first conductive stack I'' has a BEOL layer at a first elevation with reference to the substrate 102. The second conductive stack II'' of FIG. 3B also has its BEOL layer at a second elevation with reference to the substrate 102. The first elevation differs from the second elevation. Again, the BEOL layer of any conductive stack can also include multiple conductive layers. As described herein, the term "elevation" may refer to a distance between an active surface of the substrate 102 and a surface of a conductive layer, or a surface of the conductive stack proximate to active surface of the substrate 102 and within the BEOL layer.

For example, in a given BEOL layer of a conductive stack, portions of the same conductive layer may also be at different elevations. The proximate surface of a conductive layer is the surface of the layer that is closest to the substrate 102, and also opposite the active surface of the conductive layer. For example, provided the orientation in FIG. 3B, the active surface of a given layer is the "top surface" and the proximate surface of the layer is the "bottom surface". As a result, the elevation for the BEOL layer of the first conductive stack I'' is the distance from the top surface or active surface of the substrate 102 to the bottom surface or proximate surface of the higher, leftmost portion of the third conductive layer 114. In this example, the leftmost portion of the third conductive layer 114 is the highest conductive layer portion, or portion of the conductive layer farthest away from the substrate 102 of the BEOL layer of the first conductive stack I''.

For a layer or portion of a layer with the orientation of FIG. 3B, the elevation is defined to be the distance between the active surface or top surface of the substrate 102 to the proximate surface or bottom surface of the layer or portion of the layer.

In one configuration, the elevation of the BEOL conductive layer within a given conductive stack can be defined to be the elevation of the highest conductive layer portion, or portion of the conductive layer farthest away from the substrate 102 within the BEOL conductive layer. In this configuration, the elevation of a conductive stack can also be defined as the elevation of the BEOL conductive layer within that conductive stack.

FIGS. 4A to 4E show layout views of different device layers to further illustrate various stress mitigation structure implementations according to aspects of the disclosure.

Figure 4A:
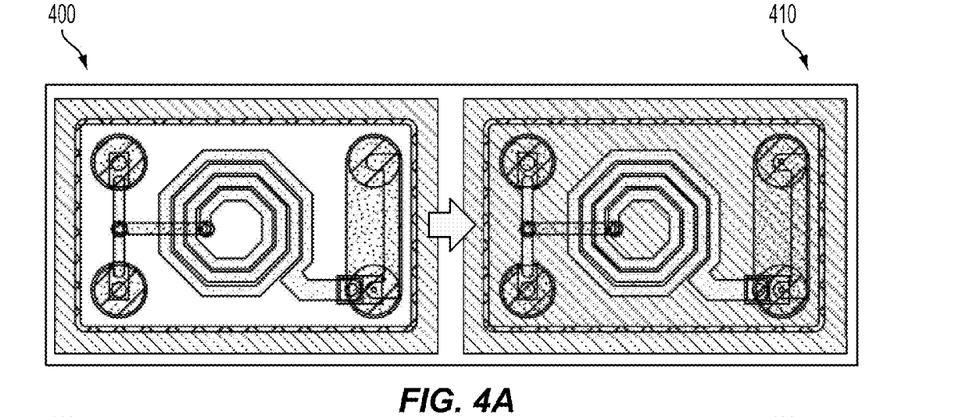
FIGS. 4A to 4E show layout views of different layers of devices without and with a stress mitigation structure implementation according to aspects of the disclosure.

FIG. 4A shows a layout view to distinguish a device 400 without a stress mitigation structure implementation from a device 410 including a stress mitigation structure implementation. The individual layers that make up device 400 and the device 410 are further described in FIGS. 4B to 4E. The device 400 is a layout view of a device similar to the integrated circuit device 100, a cross-sectional view of which is shown in FIG. 3A. In addition, the device 410 is a layout view of a device similar to the stress mitigation structure 300, a cross-sectional view of which is shown in FIG. 3B.

Figure 4B:
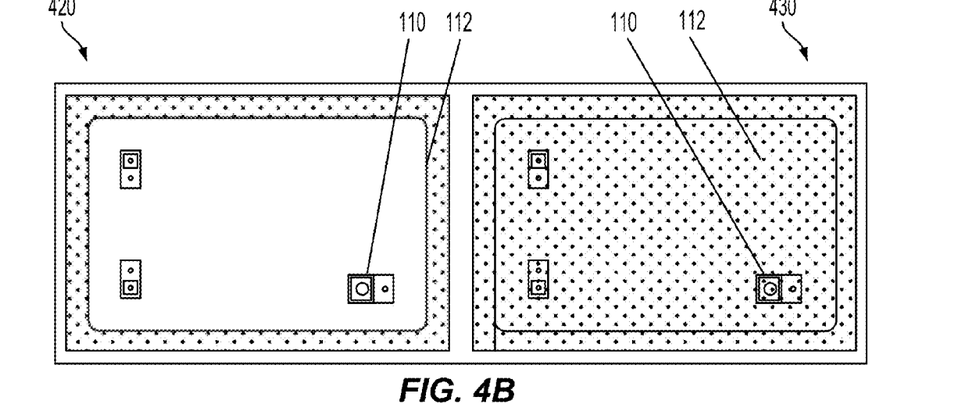

FIG. 4B shows a device layer 420 without a stress mitigation structure implementation and a device layer 430 with a stress mitigation structure implementation. The device layer 420 includes the first interlayer dielectric 110. The first via 112 is also arranged within the device layer 420. A layer of material covers the first vias 112 in the device layer 430. This layer of material shows where the first interlayer dielectric 110 is removed for the stress mitigation structure implementation of the device layer 430. The first interlayer dielectric 110 is disposed at the same layer as the first via 112. In this arrangement, both the first interlayer dielectric 110 and the first via 112 enable removal of the interlayer dielectric material (e.g., the first interlayer dielectric 110). In the device layer 430, the first interlayer dielectric 110 and the first via 112 may be drawn as a negative mask.

Figure 4C:
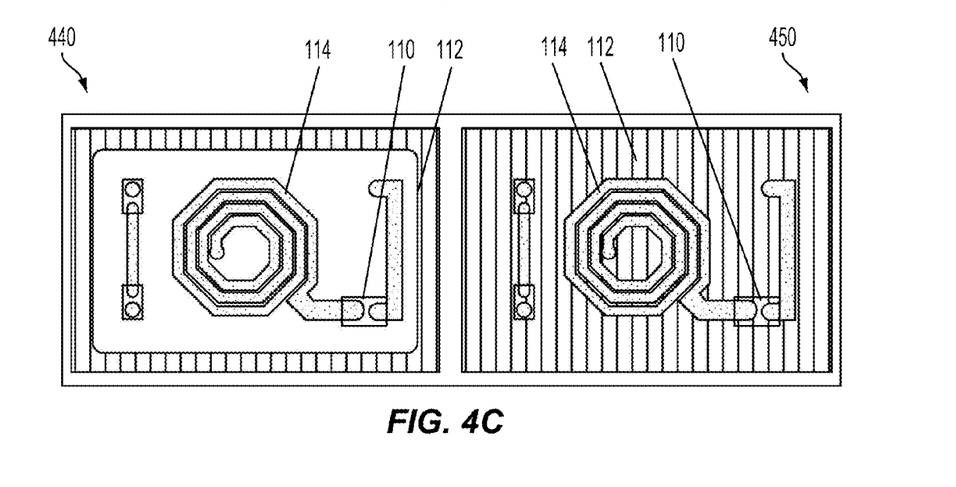

FIG. 4C shows a device layer 440 without a stress mitigation structure implementation and a device layer 450 with a stress mitigation structure implementation. In this arrangement, the third conductive layer 114 and the first interlayer dielectric 110 are both shown in the device layer 440 and the device layer 450. The first via 112 can be seen in the device layer 440. Another layer of material covers the first via 112 in device layer 450. This layer of material is similar to the layer of material covering the first via 112 in device layer 430 of FIG. 4B. The third conductive layer 114 is, however, is overlaid on the layer of material in device layer 450 rather than the layer of material in device layer 430. This layer of material also shows where the first interlayer dielectric 110 is removed. The first via 112 and the first interlayer dielectric 110 are similar because they show where the first interlayer dielectric 110 is removed.

Figure 4D:
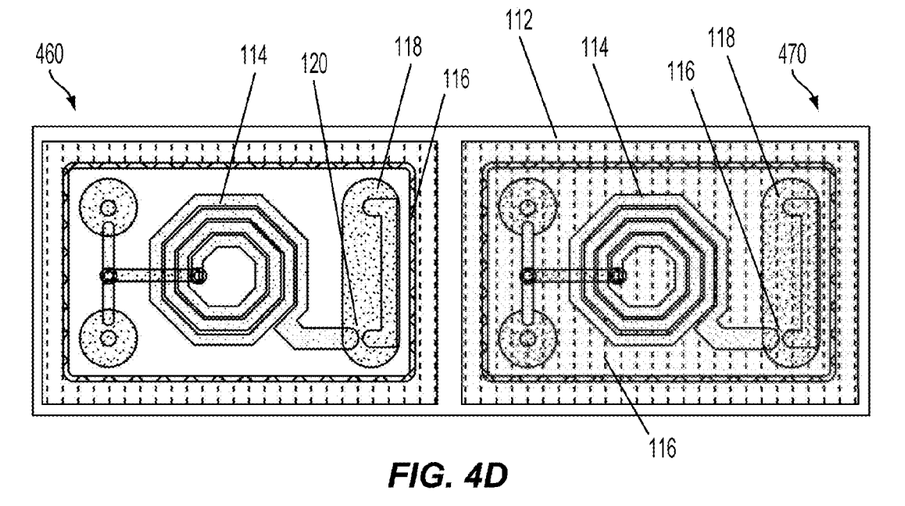

FIG. 4D shows a device layer 460 without a stress mitigation structure implementation and a device layer 470 with a stress mitigation structure implementation. In this arrangement, the third conductive layer 114, the fourth conductive layer 118 and the second interlayer dielectric 120 can be seen in both the device layer 460 and the device layer 470. The second via 116 can be seen in the device layer 460. Another layer of material covers the second vias 116 in the device layer 470. This layer of material is the opening in the second interlayer dielectric 120, similar to the opening of the first interlayer dielectric 110 in the device layer 450 of FIG. 4C and the device layer 430 of FIG. 4B. This layer of material also shows where the second interlayer dielectric 120 is removed. The second via 116 and the second interlayer dielectric 120 are also similar because they show where the second interlayer dielectric 120 is removed.

Figure 4E:
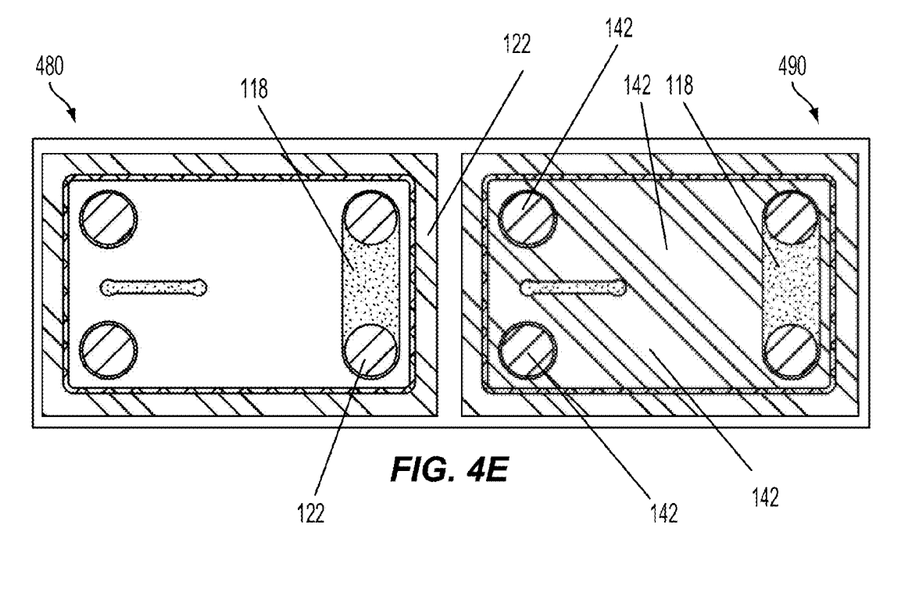

FIG. 4E shows a device layer 480 without a stress mitigation structure implementation and a device layer 490 with a stress mitigation structure implementation. The fourth conductive layer 118 and the third interlayer dielectric 122 are shown in both the device layer 480 and the device layer 490. The interconnect 142 can be seen in the device layer 480. Another layer of material covers the interconnect 142 in the device layer 490. This layer of material is where the interconnect 142 is removed. The interconnect 142 and the third interlayer dielectric 122 are also similar because they show where the passivation layer (e.g., last interlayer dielectric layer) is removed. In one arrangement, the interconnect 142 may be shown in FIG. 3A and FIG. 3B as the rectangular portion of the interconnect 142 that fits into the fourth conductive layer 118, also known as VP.

Figure 5:
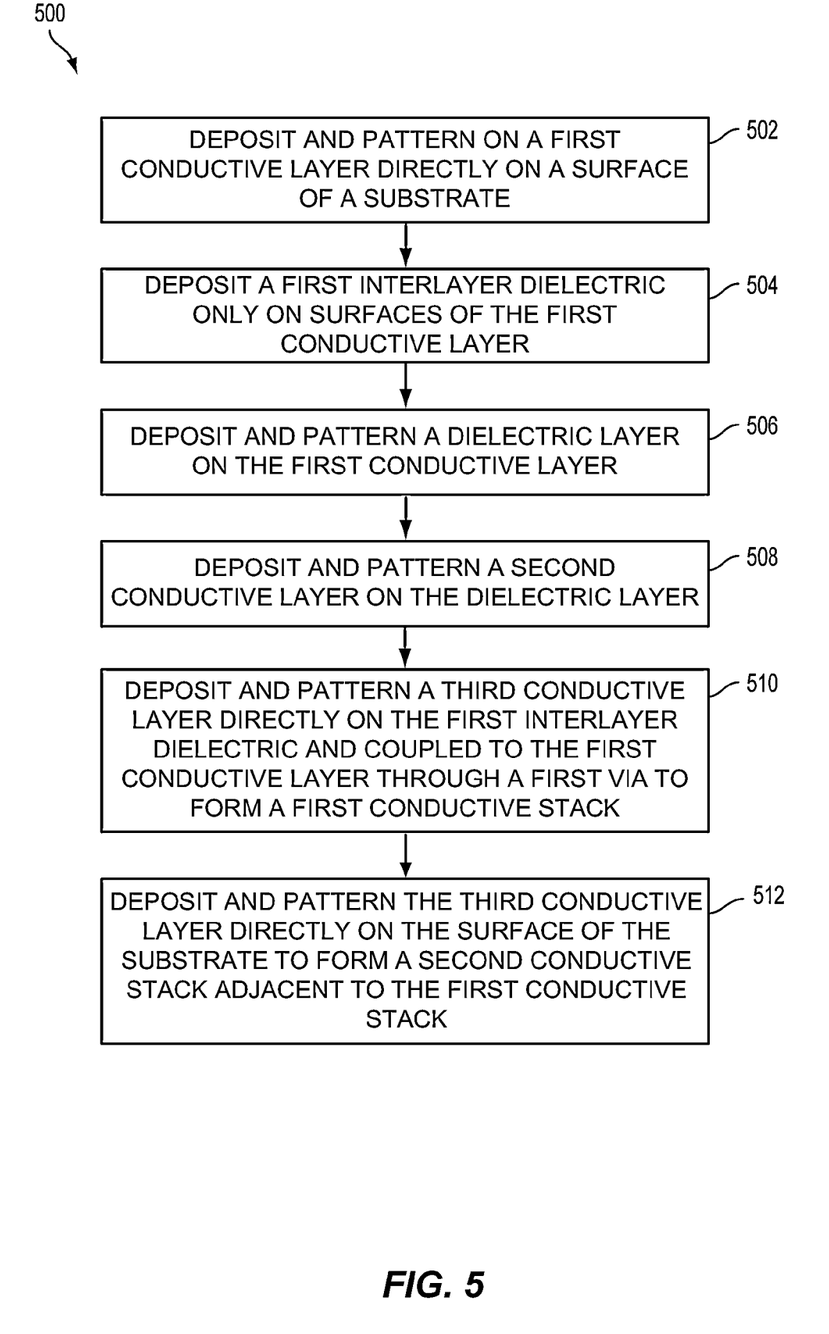
FIG. 5 is a process flow diagram illustrating a process to fabricate a stress mitigation structure according to an aspect of the disclosure.

FIG. 5 is a process flow diagram illustrating a process 500 to fabricate a stress mitigation structure according to an aspect of the disclosure. In block 502, a first conductive layer is deposited and patterned directly on a surface of a substrate. For example, the first conductive layer may be one of the first conductive layer 104 (e.g., M1), the second conductive layer 108 (e.g., M2), the third conductive layer 114 (e.g., M3), the fourth conductive layer 118 (e.g., M4), or the fifth conductive layer 136 (e.g., M5) that is deposited and on a surface of the substrate 102. In block 504, a first interlayer dielectric is deposited only on surfaces of the first conductive layer. For example, the first interlayer dielectric may be the first interlayer dielectric 110 (ILD-1) that is deposited on the first conductive layer 104 (e.g., M1). In block 506, a dielectric layer is deposited and patterned on the first conductive layer. For example, the dielectric layer may be dielectric layer 106.

In block 508, a second conductive layer is deposited and patterned on the dielectric layer. For example, the second conductive layer may be one of the first conductive layer 104 (e.g., M1), the second conductive layer 108 (e.g., M2), the third conductive layer 114 (e.g., M3), the fourth conductive layer 118 (e.g., M4), or the fifth conductive layer 136 (e.g., M5) that is deposited and on a surface of the dielectric layer 106. The second conductive layer may be coupled to the first conductive layer with a via to form a first conductive stack.

In block 510, a third conductive layer is deposited and patterned directly on the first interlayer dielectric and coupled to the first conductive layer through a first via to form a first conductive stack. For example, as shown in FIG. 3B, the third conductive layer 114 (e.g., M3) is deposited and patterned directly on the first interlayer dielectric 110 (e.g., ILD-1) within the first conductive stack I″. The first interlayer dielectric 110 also contains a gap where the third conductive layer 114 is coupled to the first conductive layer 104 (e.g., M1) with the first via 112.

In block 512, the third conductive layer is deposited and patterned directly on the surface of the substrate to form a second conductive stack adjacent to the first conductive stack. For example, as shown in FIG. 3B, the third conductive layer 114 is deposited and patterned directly on the surface of the substrate 102 in the second conductive stack II″ adjacent to the first conductive stack I″. Furthermore, the third conductive layer 114 is deposited and patterned directly on the surface of the substrate 102 within the first conductive stack I′. This structure may be treated as a separate conductive stack (e.g., another second conductive stack) if the structure to the left of it including the third conductive layer 114, the first interlayer dielectric 110 and the first conductive layer 104 is treated as a separate conductive stack (e.g., another first conductive stack).

In one configuration, an integrated circuit device includes means for supporting, a first conductive stack and a second conductive stack. In one aspect of the disclosure, the means for supporting may be the substrate 102. In another aspect, the aforementioned means may be any module or any apparatus configured to perform the functions recited by the aforementioned means.

The substrate 102 may be made of glass or other high-insulation materials such as gallium arsenide (GaAs), indium phosphide (InP), silicon carbide (SiC), sapphire (Al2O3), quartz, silicon on insulator (SOI), silicon on sapphire (SOS), high resistivity silicon (HRS), aluminum nitride (AlN), a plastic substrate, a laminate, or a combination thereof.

In one implementation, the conductive material for the various conductive material layers may be copper (Cu), or other like conductive materials with high conductivity. For example, the first conductive layer 104 (e.g., M1), the second conductive layer 108 (e.g., M2), the third conductive layer 114 (e.g., M3), the fourth conductive layer 118 (e.g., M4), or the fifth conductive layer 136 (e.g., M5) may include copper (Cu), aluminum (Al), silver (Ag), gold (Au), nickel (Ni), iron (Fe), or tungsten (W). The aforementioned conductive material layers may also be deposited by electroplating, chemical vapor deposition (CVD), physical vapor deposition (PVD), sputtering, or evaporation.

The interlayer dielectrics (e.g., 110, 120, 122, 140) may be any material having a low k, or a low dielectric constant value, including silicon dioxide ($SiO_2$) and fluorine-doped, carbon-doped, and porous carbon-doped forms, as well as spin-on organic polymeric dielectrics such as polyimide (PI), benzocyclobutene (BCB), polybenzoxazole (PBO), polynorbornenes, and polytetrafluoroethylene (PTFE), spin-on silicone based polymeric dielectrics and silicon nitrogen-containing oxycarbides (SiCON). These aforementioned layers may also be deposited by a spin-coating process, chemical vapor deposition (CVD), plasma-enhanced chemical vapor deposition (PECVD), and physical vapor deposition (PVD) processes such as sputtering.

Figure 6:
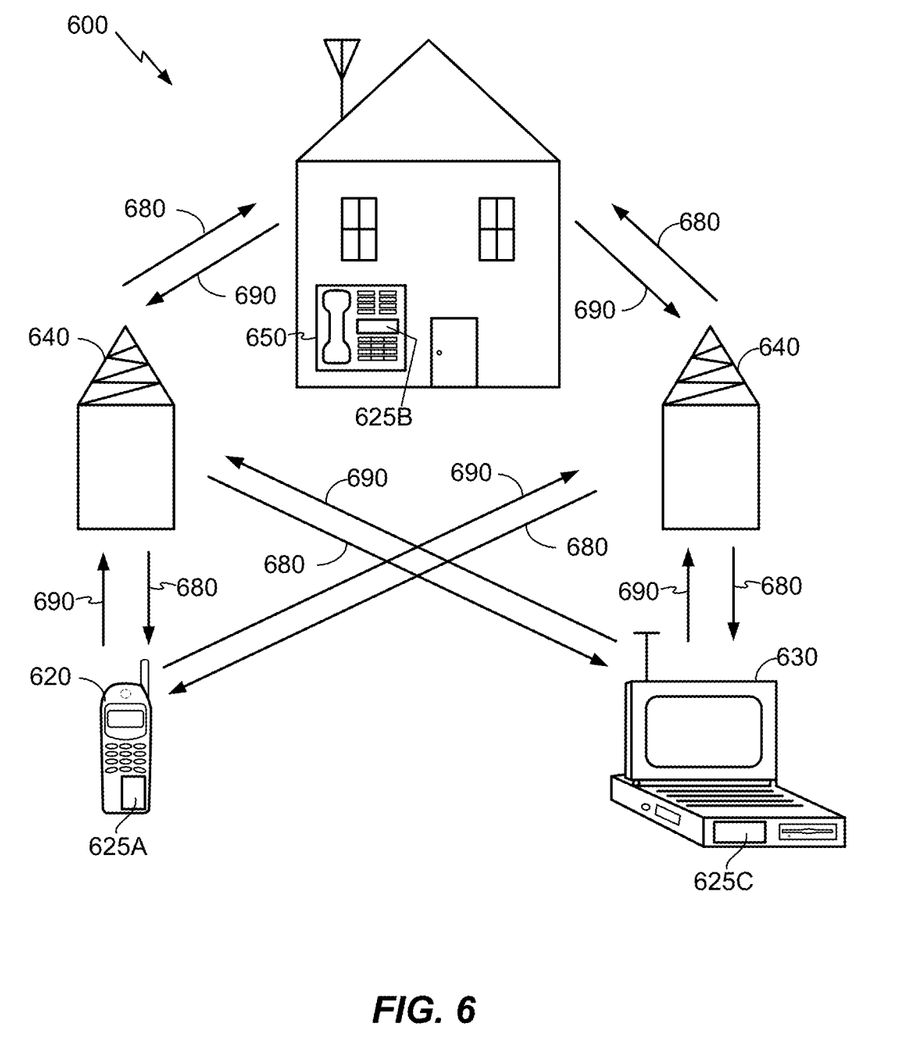
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed devices (e.g., stress mitigation structures or SMSs). It will be recognized that other devices may also include the disclosed devices (e.g., stress mitigation structures), such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a personal data assistant, a GPS enabled device, a navigation devices, a set top box, a music players, a video player, an entertainment unit, a fixed location data unit such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed devices.

Figure 7:
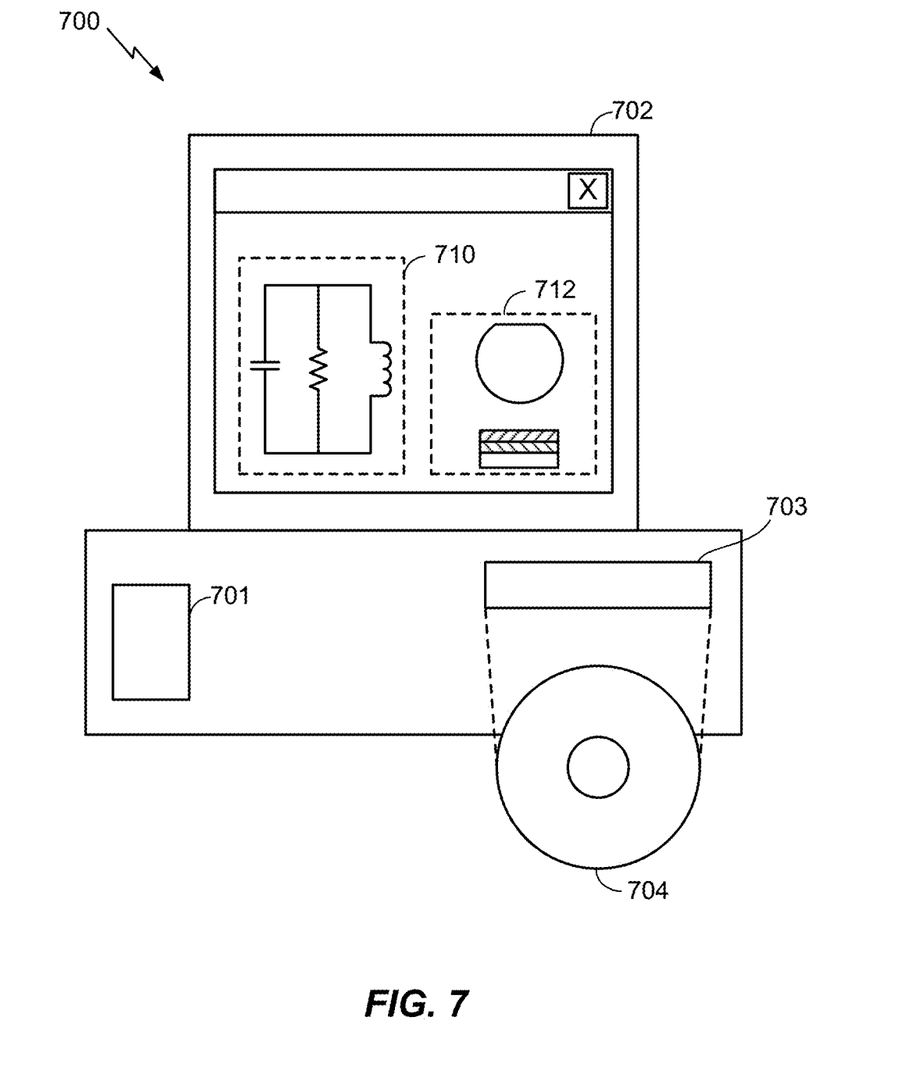
FIG. 7 is a block diagram illustrating a design workstation used for circuit, layout, and logic design of a semiconductor component according to one configuration.

FIG. 7 is a block diagram illustrating a design workstation 700 used for circuit, layout, and logic design of a semiconductor component, such as the devices disclosed above containing the stress mitigation structure. A design workstation 700 includes a hard disk 701 containing operating system software, support files, and design software such as Cadence or OrCAD. The design workstation 700 also includes a display 702 to facilitate design of a circuit 710 or a semiconductor component 712 such as the disclosed device (e.g., stress mitigation structures). A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers or dies.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above," "below," "top" and "both" are used with respect to a substrate or electronic device. Of course, if the substrate or electronic device is inverted, above becomes below, top becomes both and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated device comprising:
a substrate supporting a first interlayer dielectric;
a first conductive stack comprising a back-end-of-line (BEOL) conductive layer at a first elevation with reference to the substrate, wherein the first conductive stack comprises a first conductive layer directly on a surface of the substrate, the first interlayer dielectric directly on surfaces of the first conductive layer, a dielectric layer on the first conductive layer, a second conductive layer on the dielectric layer, and a third conductive layer directly on the first interlayer dielectric and coupled to the first conductive layer through a first via as the BEOL conductive layer at the first elevation; and
a second conductive stack comprising the BEOL conductive layer at a second elevation relative to the substrate that differs from the first elevation, wherein the second conductive stack comprises the third conductive layer directly on the surface of the substrate as the BEOL conductive layer at the second elevation.

2. The integrated device of claim 1, wherein the surface of the substrate is exposed between the first conductive stack and the second conductive stack.

3. The integrated device of claim 1, comprising an inductor formed with the first conductive layer and the third conductive layer.

4. The integrated device of claim 1, wherein the first conductive stack comprises a metal-insulator-metal capacitor formed with the first conductive layer, the dielectric layer between the first conductive layer and the second conductive layer, and the second conductive layer.

5. The integrated device of claim 1 incorporated into at least one of a music player, a video player, an entertainment unit, a navigation device, a communications device, a personal digital assistant (PDA), a fixed location data unit, and a computer.

6. An integrated device comprising:
means for supporting a first interlayer dielectric;
a first conductive stack comprising a back-end-of-line (BEOL) conductive layer at a first elevation with reference to the supporting means, wherein the first conductive stack comprises a first conductive layer directly on a surface of the supporting means, the first interlayer dielectric directly on surfaces of the first conductive layer, a dielectric layer on the first conductive layer, a second conductive layer on the dielectric layer, and a third conductive layer directly on the first interlayer dielectric and coupled to the first conductive layer through a first via as the BEOL conductive layer at the first elevation; and
a second conductive stack comprising the BEOL conductive layer at a second elevation relative to the supporting means that differs from the first elevation, wherein the second conductive stack comprises the third conductive layer directly on the surface of the supporting means as the BEOL conductive layer at the second elevation.

7. The integrated device of claim 6, wherein the surface of the supporting means is exposed between the first conductive stack and the second conductive stack.

8. The integrated circuit device of claim 6, comprising an inductor formed with the first conductive layer and the third conductive layer.

9. The integrated device of claim 6, wherein the first conductive stack comprises a metal-insulator-metal capacitor formed with the first conductive layer, the dielectric layer between the first conductive layer and the second conductive layer, and the second conductive layer.

10. The integrated device of claim 6 incorporated into at least one of a music player, a video player, an entertainment unit, a navigation device, a communications device, a personal digital assistant (PDA), a fixed location data unit, and a computer.

* * * * *